US009504195B2

(12) United States Patent
Dinu et al.

(10) Patent No.: US 9,504,195 B2
(45) Date of Patent: Nov. 22, 2016

(54) COVER ASSEMBLIES, KITS AND METHODS FOR COVERING ELECTRICAL CABLES AND CONNECTIONS

(71) Applicants: Tyco Electronics Corporation, Berwyn, PA (US); Tyco Electronics Canada ULC, Markham (CA)

(72) Inventors: Daniel Dinu, Woodbridge (CA); Harry Yaworski, Cary, NC (US); Sean Kennedy, Raleigh, NC (US); Mahmoud Seraj, Apex, NC (US)

(73) Assignee: Tyco Electronics Corporation, Berwyn, PA (US)

( * ) Notice: Subject to any disclaimer, the term of this patent is extended or adjusted under 35 U.S.C. 154(b) by 0 days.

(21) Appl. No.: 14/707,110

(22) Filed: May 8, 2015

(65) Prior Publication Data

US 2015/0334887 A1 Nov. 19, 2015

Related U.S. Application Data

(60) Provisional application No. 61/994,341, filed on May 16, 2014.

(51) Int. Cl.
*H02G 15/184* (2006.01)
*H05K 9/00* (2006.01)
*H02G 15/18* (2006.01)

(52) U.S. Cl.
CPC .......... *H05K 9/0088* (2013.01); *H02G 15/184* (2013.01); *H02G 15/1833* (2013.01); *H05K 9/0007* (2013.01); *Y10T 29/49197* (2015.01)

(58) Field of Classification Search
CPC .................................................... H02G 15/184
USPC ............................................. 174/73.1, 88 C
See application file for complete search history.

(56) References Cited

U.S. PATENT DOCUMENTS

| 3,816,640 A | * | 6/1974 | Varner | H02G 15/184 |
| | | | | 156/49 |
| 4,424,410 A | | 1/1984 | Edgerton | |
| 5,051,733 A | * | 9/1991 | Neuhouser | G01R 19/155 |
| | | | | 174/73.1 |

(Continued)

FOREIGN PATENT DOCUMENTS

DE   10 2007 013332 A1   9/2008

OTHER PUBLICATIONS

Notification of Transmittal of the International Search Report and the Written Opinion of the International Searching Authority, or the Declaration, in corresponding PCT Application No. PCT/US2015/030508 mailed Jul. 24, 2015 (11 pages).

(Continued)

*Primary Examiner* — Chau N Nguyen
(74) *Attorney, Agent, or Firm* — Myers Bigel, P.A.

(57) ABSTRACT

A cover assembly for covering and electrically insulating an electrical connection includes a joint body including a tubular inner sleeve and an integral semiconductor layer. The inner sleeve is formed of an elastically expandable, electrically insulating material and having an outer surface and opposed first and second terminal ends. The inner sleeve defines a through passage extending axially from a first end opening at the first terminal end of the inner sleeve to a second terminal end opening at the second end of the inner sleeve. The semiconductor layer is disposed on the outer surface of the inner sleeve and is formed of an electrically semiconductive material. The semiconductor layer extends axially from a first terminal end of the semiconductor layer to an opposing second terminal end of the semiconductor layer. The first terminal end of the semiconductor layer is spaced apart from the first terminal end of the inner sleeve a prescribed semiconductor truncation distance to define a tubular band of the outer surface that is not covered by the semiconductor layer.

19 Claims, 7 Drawing Sheets

(56) References Cited

U.S. PATENT DOCUMENTS

| | | | |
|---|---|---|---|
| 5,753,861 A * | 5/1998 | Hansen | H01R 4/70 |
| | | | 174/136 |
| 6,025,560 A | 2/2000 | De Buyst et al. | |
| 6,040,527 A | 3/2000 | De Buyst et al. | |
| 7,476,114 B1 | 1/2009 | Contreras | |
| 7,498,515 B2 * | 3/2009 | Cardinaels | H02G 15/1826 |
| | | | 174/93 |
| 7,872,197 B2 | 1/2011 | Vallauri et al. | |
| 7,901,243 B1 | 3/2011 | Yaworski | |
| 8,445,783 B2 | 5/2013 | Taylor et al. | |
| 2004/0209025 A1 * | 10/2004 | Kobayashi | B32B 1/08 |
| | | | 428/34.9 |
| 2014/0076627 A1 | 3/2014 | Maher | |

OTHER PUBLICATIONS

"QS-III 5513A, 5514A, 5515A and 5516A 15 kV Cold Shrink Inline Splice Kits", Data Sheet, 3M Company, © 3M 2002, 6 pages.

"Cold Shrink QS-III Splicing Kit", Instructions, IEEE Std. 404, 3M Company, © 3M 2003, 16 pages.

"Cold Shrink QS-III A-Series Silicone Rubber Splices", 3M Company, © 3M 2002, Retrieved Date: Feb. 28, 2014, From URL: http://multimedia.3m.com/mws/media/288563O/qsiii-cataloq.pdf, 8 pages.

* cited by examiner

COVER ASSEMBLIES, KITS AND METHODS FOR COVERING ELECTRICAL CABLES AND CONNECTIONS

RELATED APPLICATION(S)

The present application claims the benefit of and priority from U.S. Provisional Patent Application No. 61/994,341, filed May 16, 2014, the disclosure of which is incorporated herein by reference in its entirety.

FIELD OF THE INVENTION

The present invention relates to electrical cables and connections and, more particularly, to protective covers for electrical cables and electrical connections.

BACKGROUND OF THE INVENTION

In the electrical utilities industry, maintaining cable integrity may be critical. A loss of cable integrity, for example, a short circuit in a high voltage cable, may result in a crippling power outage or, even worse, a loss of life. One everyday task that may pose a great threat to cable integrity is the formation of electrical connections.

When electrical connections are formed, a bare metal surface may be exposed such as a splice connector. If the connection is made between two insulated cables, it is assumed the connection is in a harsh environment, such as a water-filled duct or buried under rocks. In turn, it is necessary to effectively rebuild the cable's electrical insulation, metallic shield, and environmental protection over this connection. If the connection was energized without rebuilding the cable layers, the metallic connection may fail immediately or very soon after. Thus, there is a need to protect such electrical connections from the environment.

Many power networks require electrical shielding that is broken into sections to prevent lossy circulating currents. A splice connection is a good place to provide a shield break because the shielding is already cut during splicing and must be remade during the splice installation. The shield break may, however, allow the two adjacent shield networks to have a high electric potential difference relative to each other due to magnetic induction caused by the current in the main power conductor. The splice must withstand high voltages on each side of its shields due to this phenomenon.

SUMMARY OF THE INVENTION

According to embodiments of the invention, a cover assembly for covering and electrically insulating an electrical connection includes a joint body including a tubular inner sleeve and an integral semiconductor layer. The inner sleeve is formed of an elastically expandable, electrically insulating material and having an outer surface and opposed first and second terminal ends. The inner sleeve defines a through passage extending axially from a first end opening at the first terminal end of the inner sleeve to a second terminal end opening at the second end of the inner sleeve. The semiconductor layer is disposed on the outer surface of the inner sleeve and is formed of an electrically semiconductive material. The semiconductor layer extends axially from a first terminal end of the semiconductor layer to an opposing second terminal end of the semiconductor layer. The first terminal end of the semiconductor layer is spaced apart from the first terminal end of the inner sleeve a prescribed semiconductor truncation distance to define a tubular band of the outer surface that is not covered by the semiconductor layer.

According to method embodiments of the invention, a method for forming a protected connection assembly includes forming an electrical connection between first and second electrical cables, and providing a cover assembly. The cover assembly includes a joint body including a tubular inner sleeve and an integral semiconductor layer. The inner sleeve is formed of an elastically expandable, electrically insulating material and having an outer surface and opposed first and second terminal ends The inner sleeve defines a through passage extending axially from a first end opening at the first terminal end of the inner sleeve to a second terminal end opening at the second end of the inner sleeve. The semiconductor layer is disposed on the outer surface of the inner sleeve and is formed of an electrically semiconductive material. The semiconductor layer extends axially from a first terminal end of the semiconductor layer to an opposing second terminal end of the semiconductor layer. The first terminal end of the semiconductor layer is spaced apart from the first terminal end of the inner sleeve a prescribed semiconductor truncation distance to define a tubular band of the outer surface that is not covered by the semiconductor layer. The method further includes mounting the cover assembly on the first and second cables such that the first and second cables and the electrical connection extend through the inner sleeve, the first cable extends out of the inner sleeve through the first end opening, and the second cable extends out of the inner sleeve through the second end opening.

According to embodiments of the invention, a protected connection assembly includes first and second electrical cables, an electrical connector forming an electrical connection between the first and second cables, and a cover assembly. The cover assembly includes a joint body including a tubular inner sleeve and an integral semiconductor layer. The inner sleeve is formed of an elastically expandable, electrically insulating material and having an outer surface and opposed first and second terminal ends The inner sleeve defines a through passage extending axially from a first end opening at the first terminal end of the inner sleeve to a second terminal end opening at the second end of the inner sleeve. The semiconductor layer is disposed on the outer surface of the inner sleeve and is formed of an electrically semiconductive material. The semiconductor layer extends axially from a first terminal end of the semiconductor layer to an opposing second terminal end of the semiconductor layer. The first terminal end of the semiconductor layer is spaced apart from the first terminal end of the inner sleeve a prescribed semiconductor truncation distance to define a tubular band of the outer surface that is not covered by the semiconductor layer. The cover assembly is mounted on the first and second cables such that the first and second cables and the electrical connection extend through the inner sleeve, the first cable extends out of the inner sleeve through the first end opening, and the second cable extends out of the inner sleeve through the second end opening.

Further features, advantages and details of the present invention will be appreciated by those of ordinary skill in the art from a reading of the figures and the detailed description of the preferred embodiments that follow, such description being merely illustrative of the present invention.

DETAILED DESCRIPTION OF EMBODIMENTS OF THE INVENTION

Figure 1:
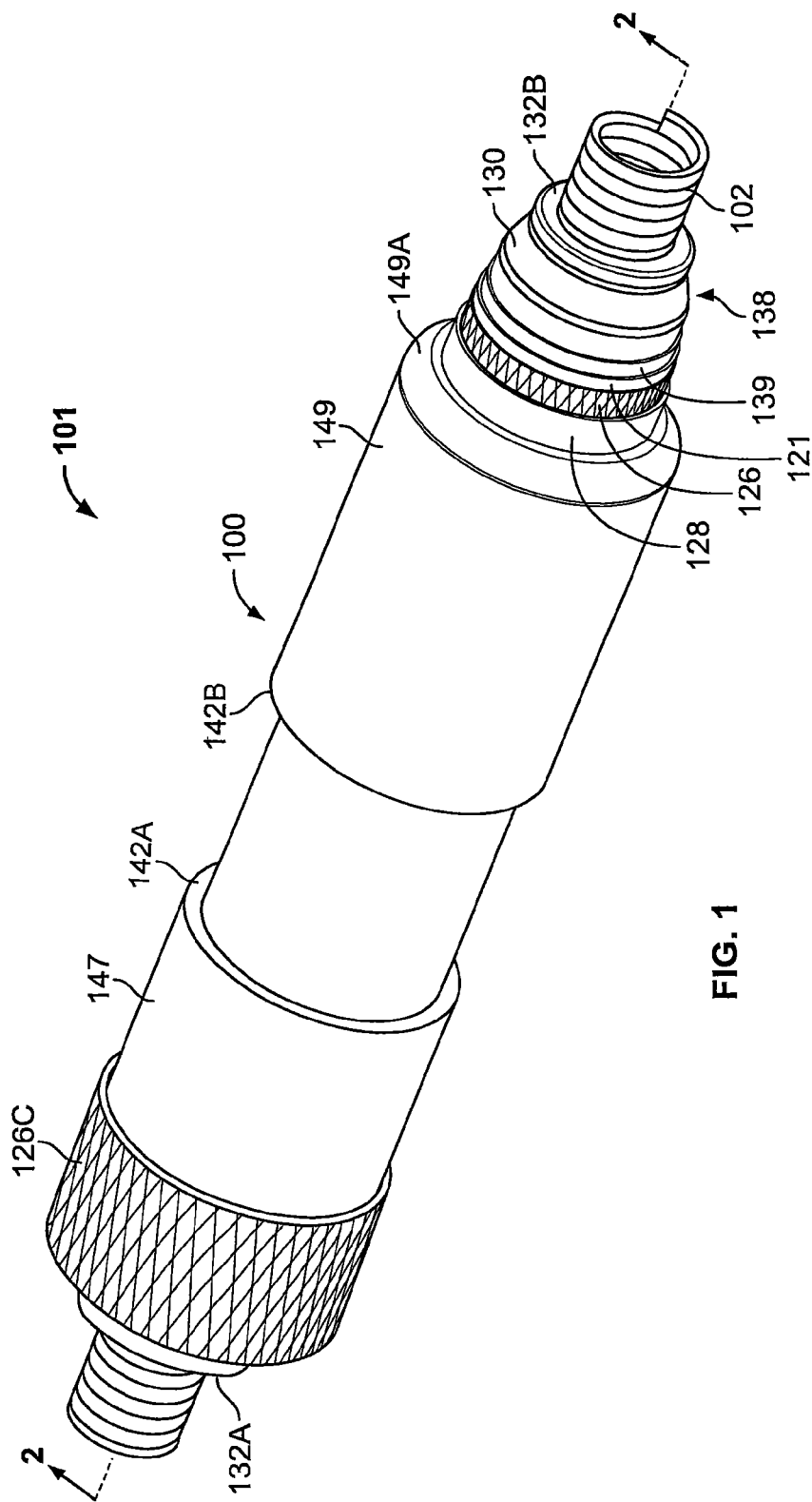
FIG. 1 is a perspective view of a pre-expanded unit according to embodiments of the present invention.

The present invention now will be described more fully hereinafter with reference to the accompanying drawings, in which illustrative embodiments of the invention are shown. In the drawings, the relative sizes of regions or features may be exaggerated for clarity. This invention may, however, be embodied in many different forms and should not be construed as limited to the embodiments set forth herein; rather, these embodiments are provided so that this disclosure will be thorough and complete, and will fully convey the scope of the invention to those skilled in the art.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90° or at other orientations) and the spatially relative descriptors used herein interpreted accordingly.

As used herein, the singular forms "a", "an" and "the" are intended to include the plural forms as well, unless expressly stated otherwise. It will be further understood that the terms "includes," "comprises," "including" and/or "comprising," when used in this specification, specify the presence of stated features, integers, steps, operations, elements, and/or components, but do not preclude the presence or addition of one or more other features, integers, steps, operations, elements, components, and/or groups thereof. It will be understood that when an element is referred to as being "connected" or "coupled" to another element, it can be directly connected or coupled to the other element or intervening elements may be present. As used herein, the term "and/or" includes any and all combinations of one or more of the associated listed items.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of this specification and the relevant art and will not be interpreted in an idealized or overly formal sense unless expressly so defined herein.

As used herein, "monolithic" means an object that is a single, unitary piece formed or composed of a material without joints or seams.

As used herein, "cold-applied" or "cold-applied cover" means that the cover or component can be assembled or installed about a substrate (e.g., a cable) without requiring the use of applied heat at the time of installation.

As used herein, "cold shrink" or "cold shrink cover" means that the cover or component can be shrunk or contracted about a substrate (e.g., a cable) without requiring the use of applied heat.

Figure 2:
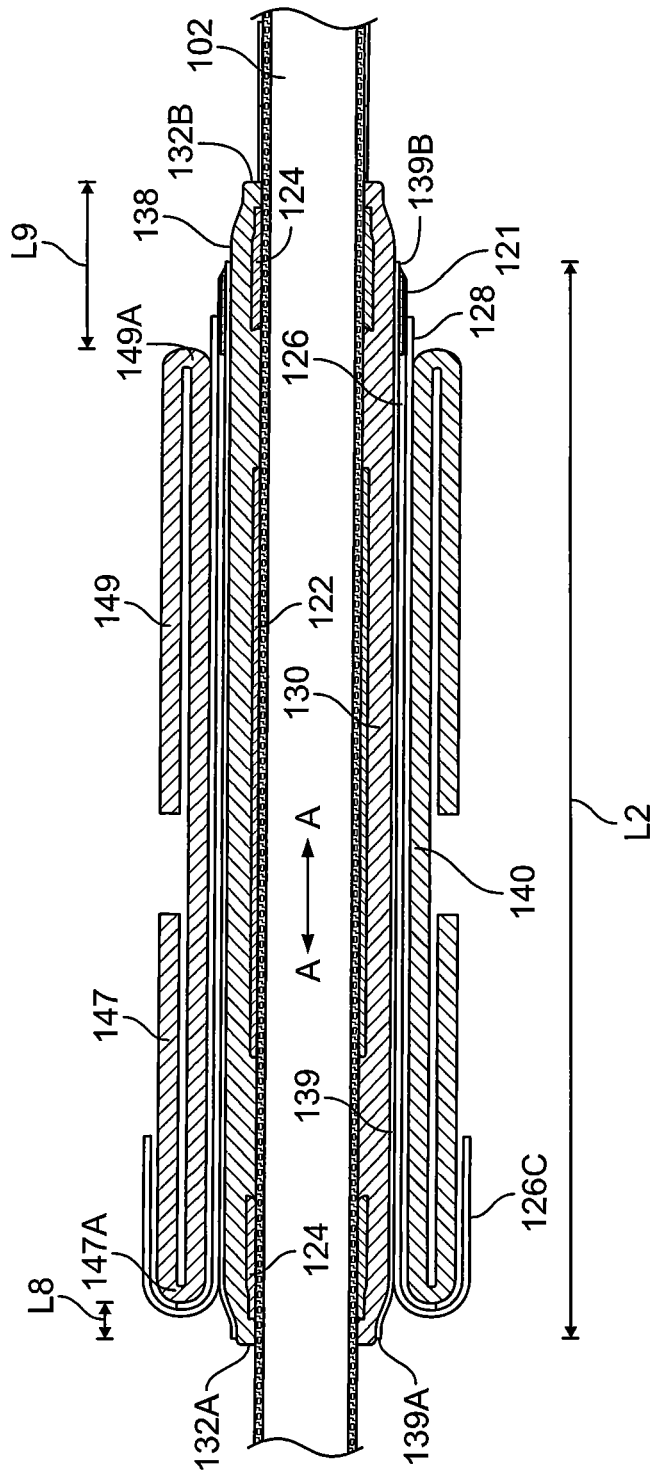
FIG. 2 is a cross-sectional view of the pre-expanded unit of FIG. 1 taken along the line 2-2 of FIG. 1.

With reference to FIGS. 1-7, a cover assembly 100 according to some embodiments of the present invention is shown therein. The cover assembly 100 may be provided as a pre-expanded unit 101 including a holdout device 102, as shown in FIGS. 1 and 2, wherein the cover assembly 100 is in an expanded state or position. The cover assembly 100 and the unit 101 may form a part of a cover system 103 (FIGS. 3-7) according to embodiments of the invention.

The cover assembly 100 and system 103 may be used to cover and electrically insulate electrical substrates such as cables and connectors. For example, the cover assembly 100 and system 103 may be used to form a protected connection assembly 10 (FIGS. 3-7) according to embodiments of the invention about a splice connection 15 between two or more cables including an electrical connector 60. According to some embodiments and as illustrated in FIGS. 3-7, the cables are jacketed concentric neutral (JCN) cables 40 and 50 (FIG. 6) and include electrically conductive (e.g., copper) concentric neutral wires 46, 56. According to some embodiments, the cables are metal tape shielded or longitudinally corrugated (LC) metal shielded cables including an electrically conductive (e.g., copper) metal shielding tape or corrugated metal sheath.

Figure 3:
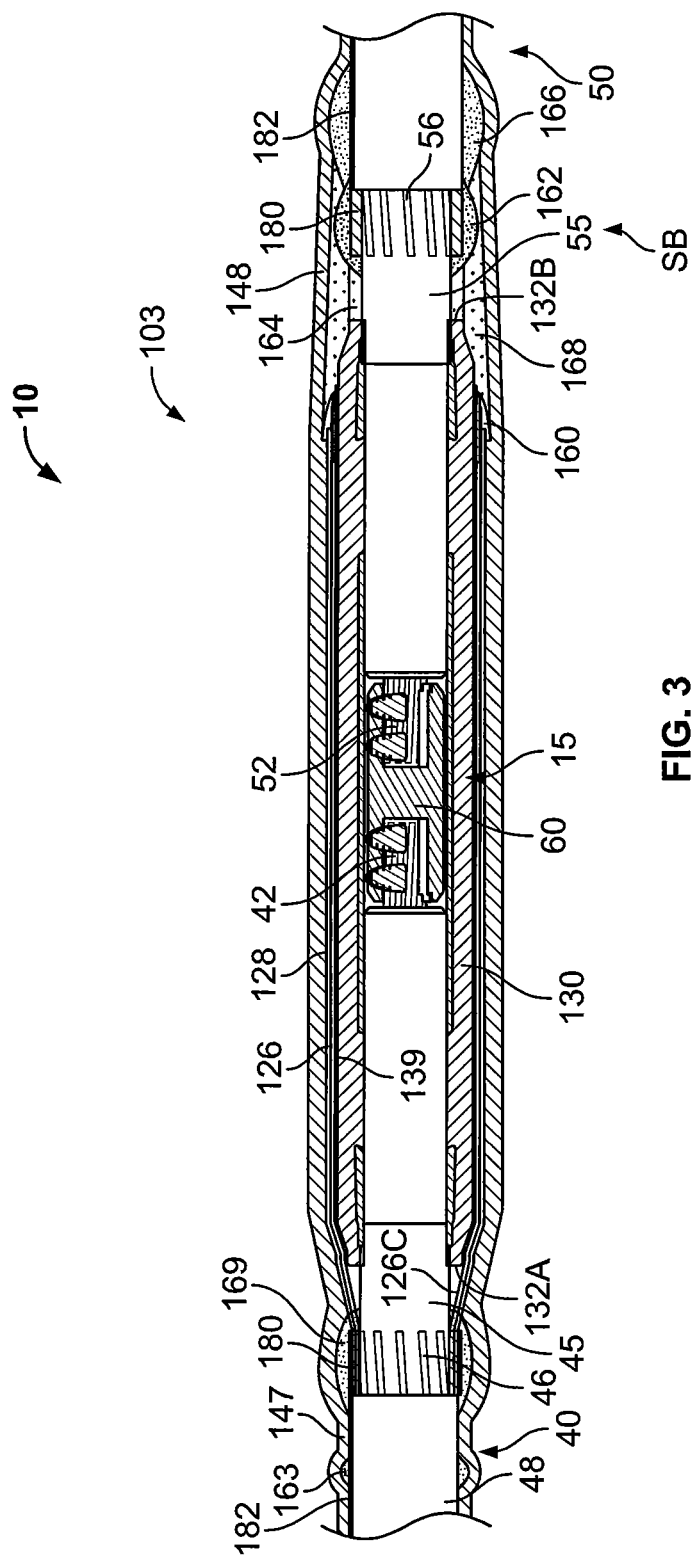
FIG. 3 is a fragmentary, cross-sectional view of a protected connection assembly including a cover assembly and cover system according to embodiments of the present invention.
Figure 4:
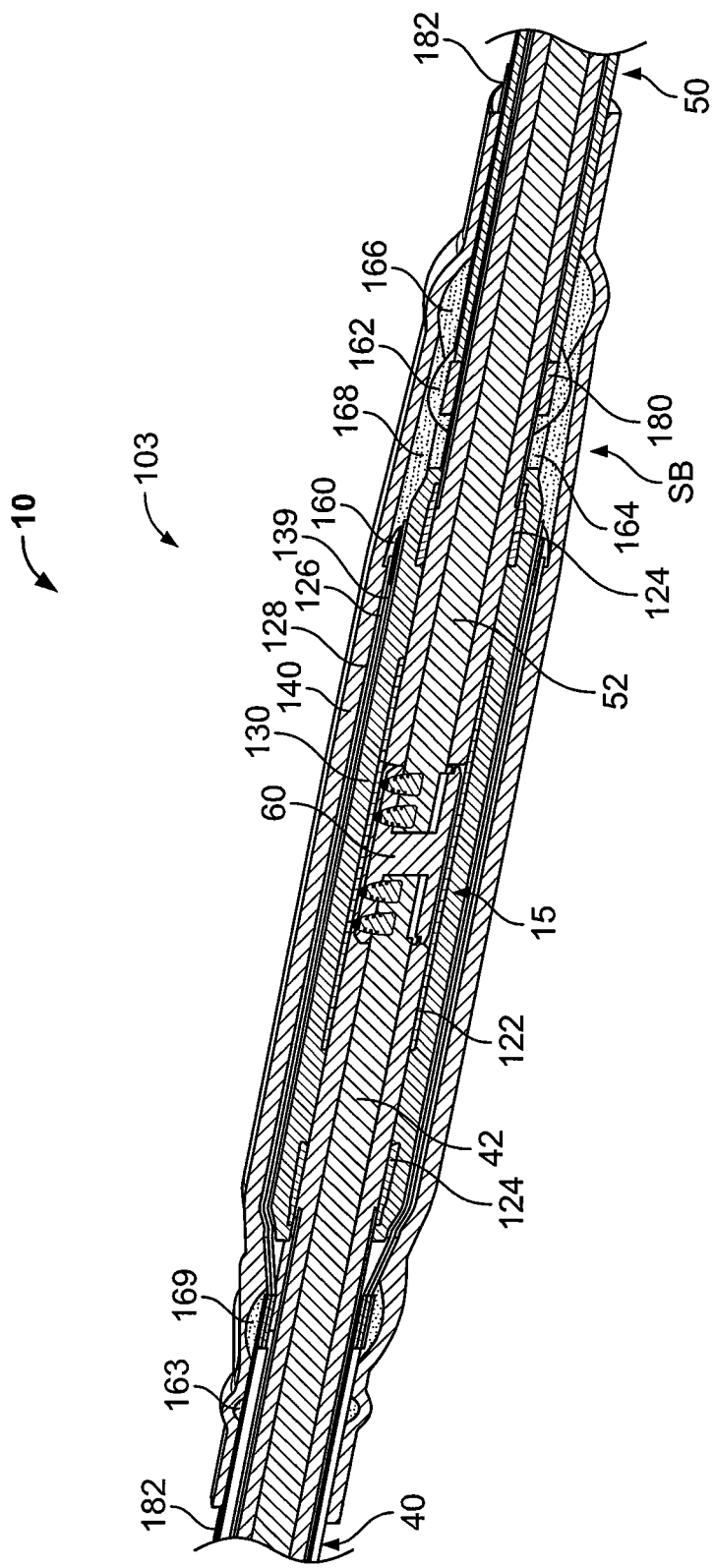
FIG. 4 is a fragmentary, perspective, cross-sectional view of the protected connection assembly of FIG. 3.

The cover assembly 100 may be deployed and mounted on the intended substrate in a retracted state or position as shown in FIGS. 3 and 4 and discussed in more detail below. According to some embodiments, the cover assembly 100 is a cold shrink cover, meaning that it can be shrunk or retracted about the substrate without requiring the use of applied heat.

Figure 6:
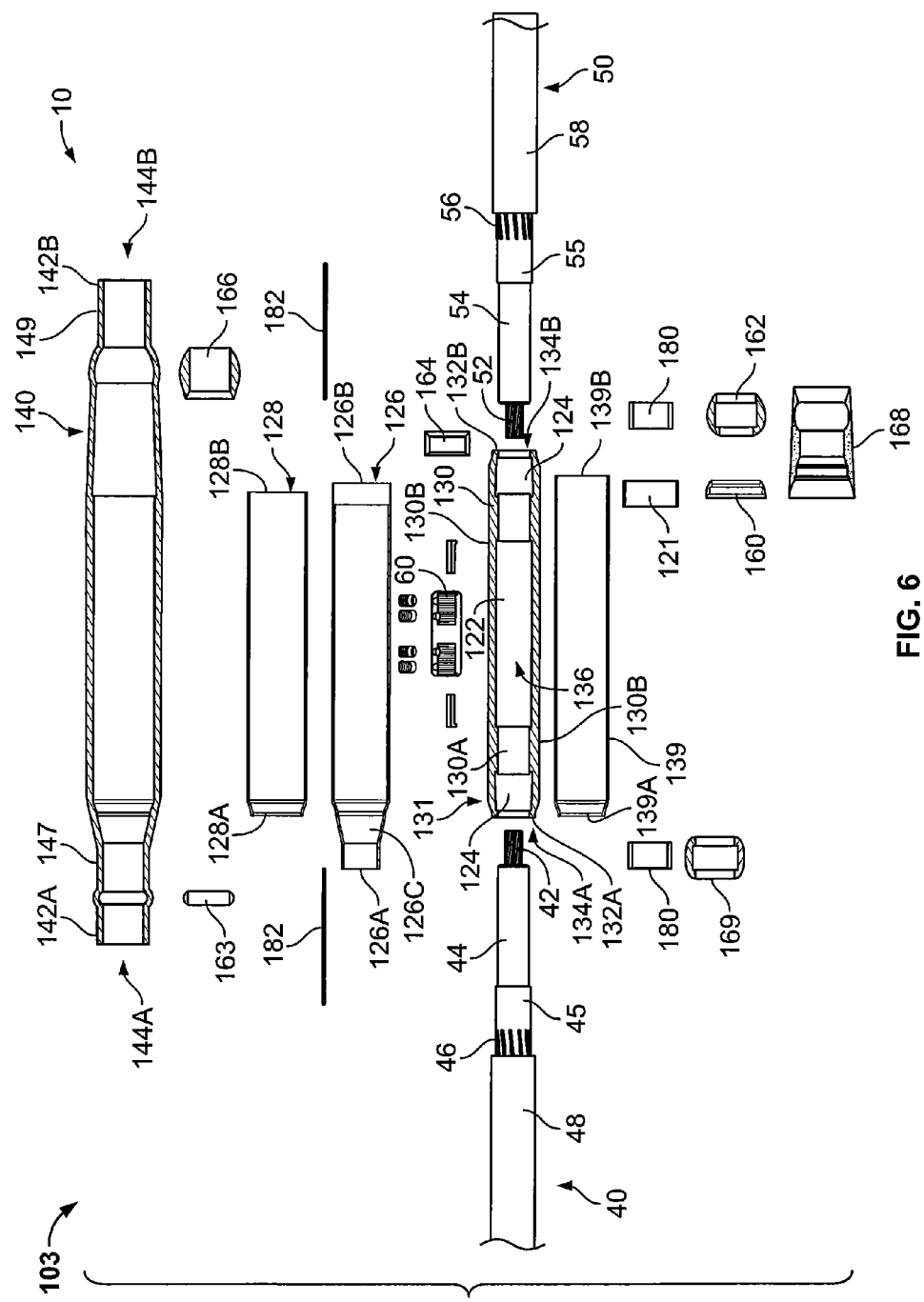
FIGS. 6 and 7 are exploded, cross-sectional views of the protected connection assembly of FIG. 3.
Figure 7:
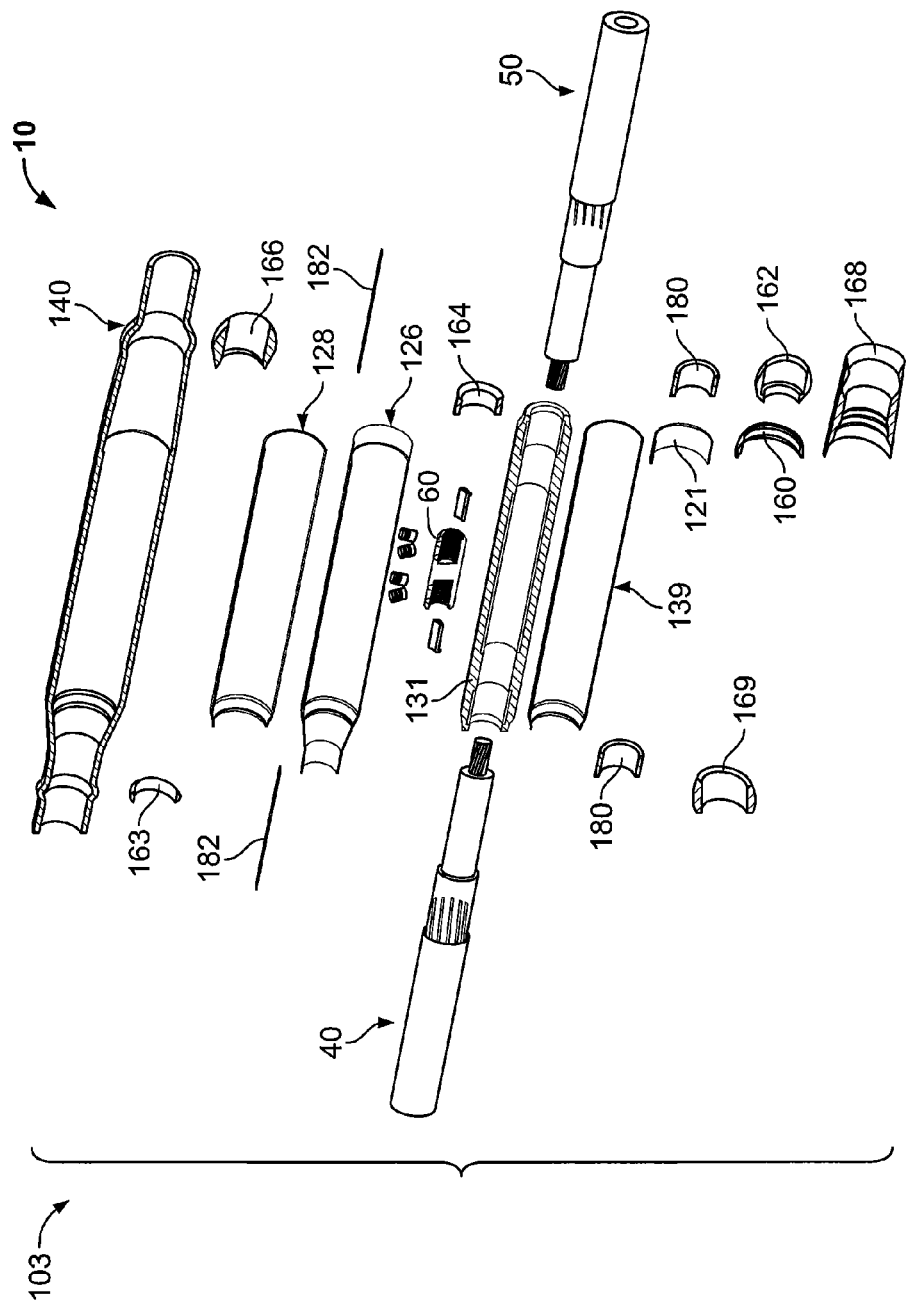

With reference to FIGS. 1, 3 and 6, the cover assembly 100 includes an integral inner sleeve assembly or joint body 131, a layer of protective tape 121, a metal shield mesh sleeve or layer 126, a separator sleeve or layer 128, and an outer sleeve (or re-jacket) 140. Referring to FIG. 2, the cover assembly 100 has a lengthwise axis A-A. According to some embodiments, the cover assembly 100 is provided pre-installed and pre-expanded on the holdout 102.

With reference to FIGS. 3 and 6, the cover system 103 further includes electrically conductive wrapping material 160, 162, 169, electrically insulating void filler material 164, 166, an electrically insulating material 168, retainers (e.g., clamps) 180, and electrically conductive grounding braids 182. Multiple or all of the foregoing components may be provided in the form of a combined or prepared kit.

The joint body 131 is provided as an integral, unitary structure extending lengthwise along the axis A-A. The joint body 131 includes an inner sleeve (or insulation body) 130, a Faraday cage layer 122, stress cone layers 124, and a semiconductor layer 139.

With reference to FIG. 6, the inner sleeve 130 has opposed inner and outer surfaces 130A and 130B, and opposed terminal ends 132A, 132B. The inner sleeve 130 is tubular and defines an axially extending conductor through passage 136 that communicates with opposed end openings 134A, 134B. The ends 132A and 132B are also the terminal ends of the joint body 131.

The inner sleeve 130 can be formed of any suitable material. According to some embodiments, the inner sleeve 130 is formed of a dielectric or electrically insulative material. According to some embodiments, the inner sleeve 130 is formed of an elastically expandable material. According to some embodiments, the inner sleeve 130 is formed of an elastomeric material. According to some embodiments, the inner sleeve 130 is formed of liquid silicone rubber (LSR). Other suitable materials may include EPDM or ethylene propylene rubber (EPR). According to some embodiments, the inner sleeve 130 has a Modulus at 100 percent elongation (M100) in the range of from about 0.4 to 0.52 MPa. In some embodiments, the inner sleeve 130 is monolithic.

According to some embodiments, the thickness of the inner sleeve 130 is in the range from about 0.07 to 2 inches. According to some embodiments, the length of the inner sleeve 130 is in the range from about 8 to 30 inches.

The Faraday cage layer 122 (FIG. 2) is illustrated as a generally tubular sleeve bonded to the inner surface 130A of the inner sleeve 130. The Faraday cage layer 122 may be formed of a suitable elastically conductive elastomer. In use, the Faraday cage layer 122 may form a Faraday cage to provide an equal potential volume about the connector 60 so that an electric field is cancelled in the surrounding air voids.

The stress cone layers 124 (FIG. 2) are illustrated as generally tubular sleeves bonded to the inner surface 130A of the inner sleeve 130 at either end 132A, 132B thereof. The stress cone layers 124 may be formed of a suitable electrically conductive elastomer. In use, the stress cone layers 124 may serve to redistribute the voltage along the surface of the cable insulation 44, 54 to reduce or prevent the degradation of the insulation 44, 54 that might otherwise occur.

According to some embodiments, the layers 122, 124 are formed of a material having a Modulus at 100 percent elongation (M100) in the range of from about 0.68 to 0.88 MPa.

The semiconductor layer 139 (FIG. 2) fully circumferentially surrounds the inner sleeve 130. The semiconductor layer 139 extends axially from a first (hereinafter, left) terminal edge or end 139A to an opposed second (hereinafter, right) terminal edge or end 139B. The end 139B is located a prescribed axial truncation distance L3 (FIG. 5) from the end 132B of the inner sleeve such that a tubular band or portion 138 of the inner sleeve 130, extending from end 139B to the end 132B, is not covered by the semiconductor layer 139. That is, the semiconductor layer 139 is truncated on the right end of the inner sleeve 130. In some embodiments and as illustrated, the left end 139A is located substantially at the end 132A of the inner sleeve 130. In other embodiments, the left end 139A may be spaced apart from the end 132A inboard a distance that is less than the distance L3.

According to some embodiments, the distance L3 (i.e., the width of the exposed portion 138) is at least 0.25 inches. In some embodiments, the distance L3 (i.e., the width of the exposed portion 138) is in the range of from about 0.25 to 4.00 inches.

The semiconductor layer 139 can be formed of any suitable electrically semiconductive material. According to some embodiments, the semiconductor layer 139 is formed of an elastically expandable material. According to some embodiments, the semiconductor layer 139 is formed of an elastomeric material. According to some embodiments, the semiconductor layer 139 is formed of carbon black and silicone. Other suitable materials may include carbon black and EPDM.

According to some embodiments, the thickness of the semiconductor layer 139 is in the range from about 0.0005 to 0.005 inches. According to some embodiments, the length L2 (FIG. 2) of the semiconductor layer 139 is in the range from about 14.00 to 30.00 inches.

The protective tape 121 circumferentially surrounds and is bonded to (e.g., by adhesive) a portion of the inner sleeve 130 inset from the end 132B. In some embodiments and as illustrated, the protective tape 121 overlies the semiconductor layer 139. The protective tape 121 may be formed of any suitable material such as vinyl.

The shield mesh layer 126 circumferentially surrounds the inner sleeve 130. The shield mesh layer 126 has opposed terminal ends 126A and 126B. The end 126B is located a prescribed axial truncation distance L4 (FIG. 5) from the end 132B of the inner sleeve 130, is located a prescribed axial distance L5 (FIG. 5) from the end 139B of the semiconductor layer 139, and overlies the protective tape 121. The protective tape 121 may serve to protect the semiconductor layer 139 and the inner sleeve layer 130 from the terminal edge of the shield mesh layer 126, which may be sharp or jagged. When deployed (rolled out) as discussed below and shown in FIGS. 3-5, the end 126A of the shield mesh layer 126 extends axially beyond the end 132A of the inner sleeve 130 to form a shield extension section 126C. The extension section 126C does not extend as far out as the outer sleeve 140.

According to some embodiments, the distance L4 is in the range of from about 1.00 to 4.25 inches.

According to some embodiments, the distance L5 is in the range of from about 0.01 to 1.00 inch.

The shield mesh layer 126 may be formed of braided or woven copper filaments, for example.

The separator layer 128 circumferentially surrounds the shield mesh layer 126. The separator layer 128 has opposed terminal ends 128A and 128B. The end 128B is located a prescribed axial distance L6 (FIG. 5) from the end 132B of the inner sleeve 130 and is located a prescribed axial distance L7 (FIG. 5) from the end 139B of the semiconductor layer 139. In some embodiments, the separator layer 128 is omitted.

According to some embodiments, the distance L6 is in the range of from about 1.25 to 6.00 inches.

According to some embodiments, the distance L7 is in the range of from about 0.25 to 2.00 inches.

The separator layer 128 may be an open mesh or netting formed of a polymeric material such as low density polyethylene (LDPE), for example.

The outer sleeve 140 circumferentially surrounds the separator layer 128. The outer sleeve 140 has opposed ends 142A, 142B. The inner sleeve 140 is tubular and defines an axially extending conductor through passage that communicates with opposed end openings 144A, 144B. When mounted on the holdout 102, outer sections 147 and 149 of the outer sleeve 140 are folded back on an intermediate section 148 of the outer sleeve 140 at annular folds 147A and 149A, respectively.

The fold 147A is spaced an axial fold distance L8 (FIG. 2) from the end 132A of the inner sleeve 130 while the fold 149A is spaced a greater axial fold distance L9 (FIG. 2) from the end 132B. According to some embodiments, the distance L9 is in the range of from about 1.50 to 6.25 inches.

The outer sleeve 140 can be formed of any suitable material. According to some embodiments, the outer sleeve 140 is formed of an electrically insulative material. According to some embodiments, the outer sleeve 140 is formed of an elastically expandable material. According to some embodiments, the outer sleeve 140 is formed of an elastomeric material. According to some embodiments, the outer sleeve 140 is formed of ethylene propylene diene monomer (EPDM) rubber. Other suitable materials may include neoprene or other rubber. According to some embodiments, the outer sleeve 140 has a Modulus at 100 percent elongation (M100) in the range of from about 0.6 to 1.1 MPa.

According to some embodiments, the thickness of the outer sleeve 140 is in the range of from about 0.11 to 0.25 inch. According to some embodiments, the length of the outer sleeve 140 is in the range of from about 15 to 35 inches.

The holdout 102 can be formed of any suitable material. According to some embodiments, the holdout 102 is formed of a rigid cardboard or plastic. According to some embodiments, the holdout 102 includes a strip helically wound to form a rigid cylinder as illustrated, for example. The holdout device 102 may be factory installed. In some embodiments, the cover assembly 100 may instead be pre-expanded in the field using a suitable expansion tool.

The cover assembly 100 may be formed by any suitable method and apparatus. According to some embodiments, the inner sleeve 130 and the outer sleeve 140 are separately formed (for example, by molding or extrusion) and thereafter the outer sleeve 140, the shield mesh sleeve 126, and the separator sleeve 128 are mounted on the inner sleeve 130. According to some embodiments, the inner sleeve 130 is unitarily molded. According to some embodiments, the outer sleeve 140 is unitarily molded. Alternatively, the inner sleeve 130 and/or the outer sleeve 140 may be extruded. According to some embodiments, one or both of these components are unitarily extruded.

The electrically conductive wrapping material 160, 162, 169 may be any suitable electrically conductive material that can be applied as described hereinbelow to conform to the underlying components and secure the metal shield mesh 126. According to some embodiments, the conductive wrapping material 160, 162, 169 is silicone. According to some embodiments, the conductive wrapping material 160, 162, 169 is EPR, such as EHVM-SEMICON-TAPE-38-9M Semiconductive Tape from TE Connectivity.

The electrically insulating void filler material 164, 166 may be any suitable electrically insulating material or medium that can be applied as described hereinbelow to conform to the underlying components and fill voids in the splice assembly as discussed below. According to some embodiments, the material 164, 166 has a volume resistivity in the range of from about $10^{13}$ to $10^{16}$ ohm-cm. The material 164, 166 may be provided in strip or tape form. In some embodiments, the void filler material 164, 166 is viscous at temperatures up to 90 degrees Celsius. According to some embodiments, the void filler material 164, 166 is an electrically insulating mastic. In some embodiments, the void filler material 164, 166 is an electrically insulating mastic self-adhesive tape. The void filler material 164, 166 may be a butyl rubber-based mastic such as S1278 Sealant Tape available from TE Connectivity.

The electrically insulating material 168 may be any suitable electrically insulating material or medium that can be applied as described hereinbelow to conform to the underlying components as discussed below. According to some embodiments, the material 168 has a volume resistivity in the range of from about $10^{13}$ to $10^{16}$ ohm-cm. The material 164, 166 may be provided in strip or tape form. According to some embodiments, the insulating material 168 is an electrically insulating mastic. In some embodiments, the insulating material 168 is an electrically insulating mastic self-adhesive tape. The insulating material 168 may be a silicone. In some embodiments, the insulating material 168 may be an EPR rubber-based tape such as HVCA-ALMAGAM-TAPE-38-9M Self-Amalgamating Tape available from TE Connectivity.

According to some embodiments, the void filler material 164, 166 has a lower viscosity than the insulating material 168 at a temperature in the range of from about −40 to 90 degrees Celsius.

Figure 5:
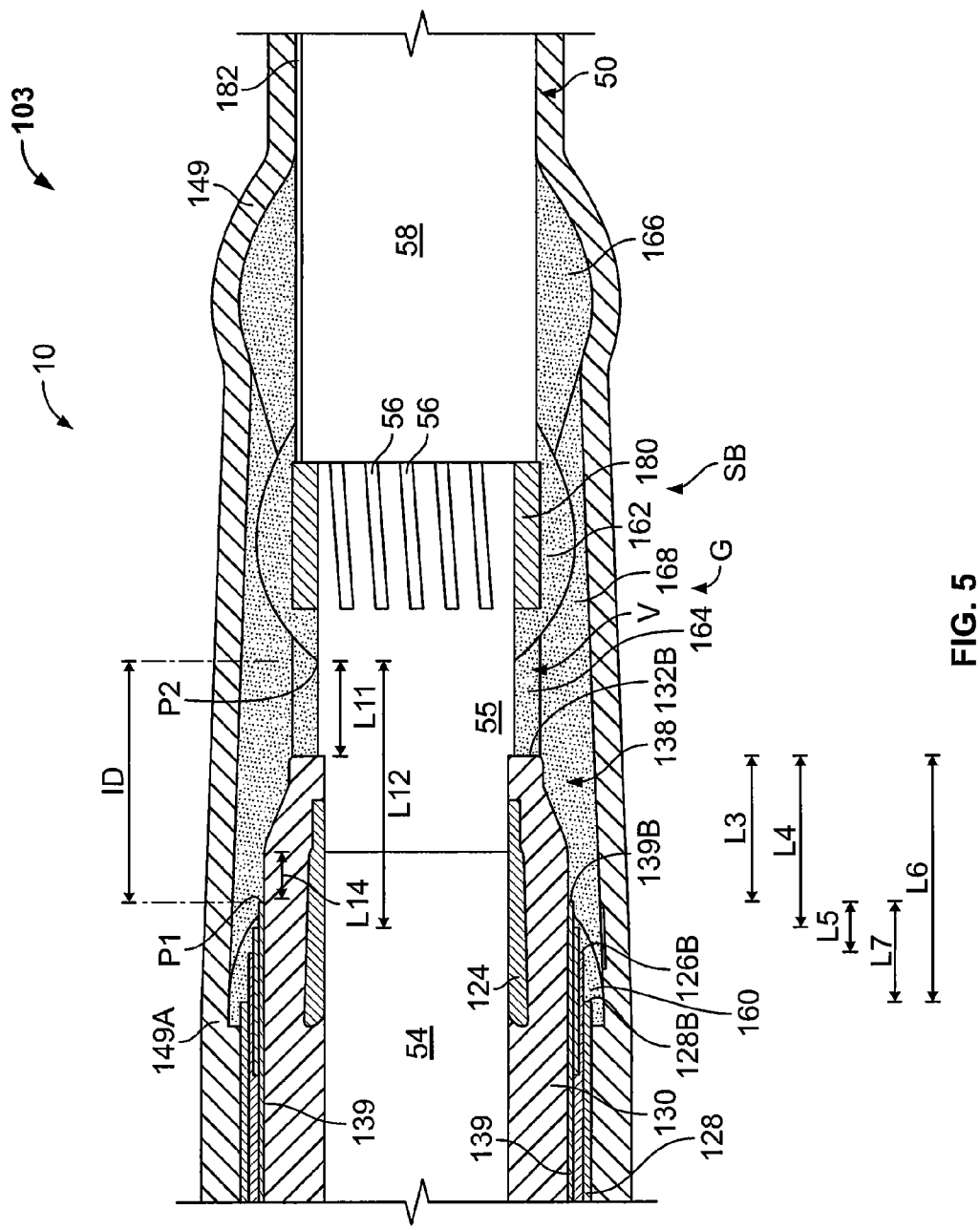
FIG. 5 is an enlarged, fragmentary, cross-sectional view of the protected connection assembly of FIG. 3.

Referring now to FIGS. 3-5, the cover assembly 100 may be applied over a splice connection 15 between a pair of electrical power transmission cables 40, 50 to form a connection assembly 10. According to some embodiments, the cables 40, 50 are low-voltage or medium-voltage (e.g., between about 5 and 46 kV) power transmission cables.

As shown in FIG. 6, the cable 40 includes a primary electrical conductor 42, a polymeric insulation layer 44, a semiconductor layer 45, a metal shield layer 46, and a jacket 48, with each component being concentrically surrounded by the next.

According to some embodiments and as shown, the cable 40 is a jacketed central neutrals cable and the shield layer 46 includes individual wires 46 (commonly referred to as neutral wires), which are helically wound about the semiconductor layer 45. In other embodiments, the shield layer 46 is a metal tape, foil, strip or sheath fully circumferentially surrounding the semiconductor layer 45 along the length of the cable. The metal strip may be longitudinally or helically wrapped about the semiconductor layer 45, for example. According to some embodiments, the cable 40 is an LC shielded cable and the shield layer 46 is a thin corrugated metal layer.

The primary conductor 42 may be formed of any suitable electrically conductive materials such as copper (solid or stranded). The polymeric insulation layer 44 may be formed of any suitable electrically insulative material such as crosslinked polyethylene (XLPE) or EPR. The semiconductor layer 45 may be formed of any suitable material such as crosslinked polyethylene (XLPE) or EPR filled with sufficient concentration of carbon black to impart volume resistivity of approximately 100 ohm-cm. The shield neutral wires (or other shield layer tape or sheath) 46 may be formed of any suitable material such as copper. The jacket 48 may be formed of any suitable material such as EPDM or PVC.

The cable 50 (FIG. 6) is similarly constructed with a primary electrical conductor 52, a polymeric insulation layer 54, a semiconductor layer 55, a metal shield layer 56, and a jacket 58 corresponding to components 42, 44, 45, 46 and 48, respectively.

The connection assembly 10 may be formed and the cover assembly 100 may be installed as follows. The cables 40, 50 are prepared as shown in FIG. 6 such that a segment of each layer extends beyond the next overlying layer. A segment 46A of the shield layer 46 (e.g., neutral wires) extends at least a prescribed distance beyond the end of the jacket 48. Similarly, a segment 56A of the shield layer (e.g., neutral wires) of the cable 50 extends at least a prescribed distance beyond the end of the jacket 58.

The pre-expanded unit 101 is slid over one of the cables 40, 50. According to some embodiments, the inside diameter of the holdout 102 is greater than the outer diameter of each cable 40, 50 such that the inner diameter of the holdout 102 is sufficient to receive the prepared cable 40, 50 and the connector 60 without undue effort. According to some embodiments, the inner diameter of the holdout 102 is at least as great as the outer diameter of the largest portion of the cables or connectors that are to be received in the passage 136. The pre-expanded unit 101 may be retained or parked on a cable 40, 50 until the operator is ready to install the cover assembly 100 on the cables 40, 50.

The electrical connector 60 is secured to each primary conductor 42, 52 to mechanically and electrically couple the primary conductors 42, 52 to one another as shown in FIG. 3. The connector 60 may be any suitable type of connector such as a metal crimp connector.

The clamp 180 is compressed about the shield layer 56 and the grounding wire or braid 182 proximate the jacket 140 to mechanically and electrically connect the braid 182 to the shield layer 56.

The pre-expanded unit 101 is then slid into position over the connector 60. The holdout 102 is then removed from the cover assembly 100, thereby permitting the elastomeric sleeves 130, 140 to relax and radially retract about the cables 40, 50 and the connector 60 as shown in FIG. 3. The inner sleeve 130 overlaps and engages the semiconductor layers 45, 55 of the cables 40, 50.

On the left side, the extension 126C of the shield mesh 126 is rolled outwardly onto the semiconductor layer 45 as shown in FIG. 3. A clamp 180 can be wrapped about the cable 40 as also shown in FIG. 3 to secure the left end edge of the shield mesh 126. The clamp 180 may encircle the exposed end of the shield layer 46 to electrically connect the shield mesh 126 and a grounding wire 182 to the shield layer 46. The electrically conductive material 169 is wrapped circumferentially about the spring clamp 180 so that all exposed metallic components are covered thereby.

A strip of sealant 163 may be applied about the outer surface of the jacket 48. In some embodiments, the sealant 163 is a mastic.

The operator then rolls the left extension section 147 of the outer sleeve 140 axially outwardly to cover the adjacent section of the cable 40. A portion of the left extension section 147 overlaps the cable jacket 48 and engages and radially compressively bears against the cable jacket 48. According to some embodiments, the axial length of overlap between the extension section 147 and the underlying jacket 48 is at least 50 mm.

With reference to FIG. 5, on the right side of the connector 60, the electrically conductive material 160 is wrapped circumferentially about the end 126B of the metal shield layer 126, and the electrically conductive material 162 is wrapped circumferentially about the spring clamp 180 so that all exposed metallic components are covered by conductive material 160, 162. As a result, a gap G (FIG. 5) is defined between the terminal end 132B of the inner sleeve 130 and the conductive material 162 having an axial spacing distance L11. In the gap G, an annular void V is defined about the exposed semiconductor layer 55. The conductive material 160 is axially spaced apart from the conductive material 162 a distance L12. The conductive materials 160, 162 can serve to reduce electric stress about these sites.

Next, the electrically insulating void filler material 164 is wrapped circumferentially about the cable semiconductor layer 55 to fill the void V as well as any other crevices in the region of the gap G. In some embodiments, the material 164 is used to build up the cable to approximately the outer diameter of the inner sleeve 130.

The electrically insulating void filler material 166 is wrapped circumferentially about the cable jacket 58.

The electrically insulating material 168 is then wrapped circumferentially about the cover assembly 100, the cable 50, the layers of materials 160, 162, 164, and the clamp 180. The electrically insulating material 168 extends axially from about the fold line 149A to the insulating material 166.

The operator then rolls the right side extension section 149 of the outer sleeve 140 axially outwardly to cover the adjacent section of the cable 50. A portion of the right extension section 149 overlaps the cable jacket 58 and engages and radially compressively bears against the cable jacket 58. The right extension section 149 also spans, surrounds and applies a radially inwardly compressive load on the insulating materials 164, 166, 168 and the other components within the extension section 149. According to some embodiments, the axial length of overlap between the extension section 149 and the underlying jacket 58 is at least 50 mm.

The relaxed inner diameter of the outer sleeve 140 is less than at least the outer diameter of the jacket layers 48, 58. Therefore, the outer sleeve 140 exerts a radially inwardly compressive or clamping force or pressure (due to elastic tension) onto the cables 40, 50. The outer sleeve 140 may thereby effect moisture barriers or liquid tight seals at the interfaces between the extension section 147 and the sealing material 163 and at the interface between the extension section 149 and the void filling material 166. These seals can protect the cable and the splice from the ingress of environmental moisture, dust and debris. According to some embodiments, the relaxed inner diameter of the inner sleeve 130 is at least 10% less than the smallest diameter cable upon which the cover assembly 100 is intended to be installed.

The cover assembly 100 is thereby fully installed to form the connection assembly 10 as shown in FIGS. 3-5.

On the left side of the connection 15, the metal shield layer 126 is electrically connected to the cable metal shield 46 by the left side clamp 180 to thereby continue the metal shield across the splice connection to the opposing end 126B of the metal shield layer 126.

On the right side of the connection 15, the metal shield layer 126 is electrically isolated from the cable metal shield 56 by the gap G (FIG. 5) to form a shield break SB extending axially from the most distal point P1 that is electrically conductive and electrically connected to the cover metal shield layer 126 to the most proximal point P2 that is electrically conductive and electrically connected to the cable metal shield layer 56. That is, the installed cover system 103 forms a shield break insulation interface having an insulation distance ID axially extending at least from point P1 to point P2. In the illustrated installation, the point P1 is the distal edge of the semiconductor layer 139 and the point P2 is the proximal edge of the conductive material 162. However, in other embodiments, the components may be differently configured (by design or variation in craft accuracy) so that other electrically connected components form the points P1 and P2. For example, the point P1 may be an edge of the conductive material 160. For example, the point P2 may be an edge of the clamp 180.

According to some embodiments, the insulation distance ID is at least 0.10 inches. In some embodiments, the insulation distance ID is in the range of from about 0.10 inches to 8.00 inches.

In some embodiments and as shown in FIG. 3, the semiconductor layer 139 axially overlaps and circumferentially surrounds the cable semiconductor layer 45 on the non-shield break side, and is axially spaced apart from the cable semiconductor layer 55 on the shield break side an axial distance L14 (FIG. 5). According to some embodiments, the distance L14 is in the range of from about 0 to 1 inch and, in some embodiments, from about 0.25 to 1 inch.

The shield break SB can function as described hereinabove to, for example, prevent lossy circulating currents. Advantageously, the shield break SB is provided at the splice connection 15, where shielding is already cut and must be remade during the splice installation. A shield break may allow the two adjacent shield networks to have a high electric potential difference relative to each other due to magnetic induction caused by the current in the main power conductor. The splice must withstand high voltages on each side of its shields due to this phenomenon. The cover system 103 and connection assembly 10 according to embodiments of the present invention can withstand such high voltages, and is relatively easy to install.

A number of features or aspects of the cover assembly 100 and cover system 103 provide advantages such as lower craft sensitivity, faster and easier installation, cost savings, compactness, and/or capability to withstand high potential differences between the shields 126 and 56.

The exposed portion 138 of the inner sleeve 130 (i.e., resulting from the truncation of the semiconductor layer 139) provides an extended insulation interface between the electrically conductive portions of the components on either side of the shield break SB. In particular, the portion 138 of the inner sleeve 130 provides electrical insulation between the cover semiconductor layer 139, the shield mesh layer 126, and the conductive material 160 on one side of the shield break SB, and the cable semiconductor layer 55, the neutral wires 56, the conductive material 162, the clamp 180 and the braid 182 on the other side. Because this insulation section is integral with the joint body 131, it is provided simply by installing the joint body 131.

Similarly, by providing the joint body 131, the shield mesh layer 126, the separator sleeve 128 and the jacket sleeve 140 as an all-in-one assembly on the holdout 102, the number of steps, parts and/or difficulty required for installation can be reduced.

Notably, the relative arrangement and configurations of the joint body 131, the shield mesh layer 126, the separator sleeve 128 and the jacket sleeve 140 can facilitate ease and consistency of installation. The shield mesh layer 126 and the separator sleeve 128 are each terminated at a prescribed distance from the end 132B of the inner insulating sleeve 130. The fold 149A of the jacket extension section 149 is located inboard of the terminal ends 126B, 128B so that the ends of the sleeves 126, 128 can be readily accessed for wrapping the conductive material 160 thereabout.

The use of the relatively softer insulating void filler material 164 in cooperation with the relatively harder insulating material 168 can ease installation. The insulating void filler material 164 more easily and reliably flows into the crevices and contours of the cable, etc. while the insulating material 168 is easier to handle and suitable for building out the remainder of the desired insulation layer.

According to some embodiments, an electrical connector of a different type may be used in place of the shear bolt connector 60.

Cover assemblies according to embodiments of the invention may be used for any suitable cables and connections. Such cable assemblies may be adapted for use, for example, with connections of medium voltage cables up to about 46 kV.

The foregoing is illustrative of the present invention and is not to be construed as limiting thereof. Although a few exemplary embodiments of this invention have been described, those skilled in the art will readily appreciate that many modifications are possible in the exemplary embodiments without materially departing from the teachings and advantages of this invention. Accordingly, all such modifications are intended to be included within the scope of this invention as defined in the claims. The invention is defined by the following claims, with equivalents of the claims to be included therein.

That which is claimed is:

1. A cover assembly for covering and electrically insulating an electrical connection, the cover assembly comprising:
   a joint body including:
      a tubular inner sleeve formed of an elastically expandable, electrically insulating material and having an outer surface and opposed first and second terminal ends, the inner sleeve defining a through passage extending axially from a first end opening at the first terminal end of the inner sleeve to a second terminal end opening at the second end of the inner sleeve;
      an integral semiconductor layer on the outer surface of the inner sleeve and formed of an electrically semiconductive material, the semiconductor layer extending axially from a first terminal end of the semiconductor layer to an opposing second terminal end of the semiconductor layer; and
      a tubular, metal shield layer surrounding the semiconductor layer;
   wherein:
      the first terminal end of the semiconductor layer is spaced apart from the first terminal end of the inner sleeve a prescribed semiconductor truncation distance to define a tubular band of the outer surface that is not covered by the semiconductor layer;
      the metal shield layer extends axially from a first terminal end of the metal shield layer to an opposing second terminal end of the metal shield layer;
      the first terminal end of the metal shield layer is spaced apart from the first terminal end of the inner sleeve a prescribed shield truncation distance to define a tubular band of the outer surface that is not covered by the metal shield layer; and
      the joint body further includes a protective tape circumferentially surrounding the semiconductor layer radially between the semiconductor layer and the first terminal end of the metal shield layer.

2. The cover assembly of claim 1 wherein the second terminal end of the semiconductor layer extends to the second terminal end of the inner sleeve or is axially spaced therefrom a second semiconductor truncation distance that is less than the prescribed semiconductor truncation distance.

3. The cover assembly of claim 1 further including a removable holdout device mounted within the inner sleeve, wherein the holdout device is operative to temporarily maintain the inner sleeve in a radially expanded state.

4. The cover assembly of claim 1 further including:
a tubular outer sleeve surrounding the metal shield layer; and
a tubular separator layer interposed between the metal shield layer and the outer sleeve.

5. The cover assembly of claim 1 wherein the metal shield layer includes a shield extension section configured to be extended axially beyond the second terminal end of the inner sleeve.

6. The cover assembly of claim 1 further including a tubular outer sleeve surrounding the inner sleeve and the semiconductor layer, wherein the outer sleeve includes:
an intermediate section surrounding the inner sleeve; and
an outer section surrounding the intermediate section and joined thereto at an annular fold;
the annular fold being spaced apart from the first terminal end of the inner sleeve a prescribed fold truncation distance to define a tubular band of the outer surface that is not covered by the outer sleeve.

7. The cover assembly of claim 1 including:
a Faraday cage layer mounted within the inner sleeve and formed of an electrically conductive elastomer; and
a stress cone mounted in the inner sleeve proximate an end thereof and formed of an electrically conductive elastomer.

8. The cover assembly of claim 1 further including:
a removable holdout device mounted within the inner sleeve, wherein the holdout device is operative to temporarily maintain the inner sleeve in a radially expanded state;
a tubular outer sleeve surrounding the metal shield layer;
a Faraday cage layer mounted within the inner sleeve and formed of an electrically conductive elastomer; and
a stress cone mounted in the inner sleeve proximate an end thereof and formed of an electrically conductive elastomer;
wherein:
the second terminal end of the semiconductor layer extends to the second terminal end of the inner sleeve or is axially spaced therefrom a second semiconductor truncation distance that is less than the prescribed semiconductor truncation distance;
the metal shield layer includes a shield extension section configured to be extended axially beyond the second end of the inner sleeve; and
the outer sleeve includes:
an intermediate section surrounding the inner sleeve; and
an outer section surrounding the intermediate section and joined thereto at an annular fold;
the annular fold being spaced apart from the first terminal end of the inner sleeve a prescribed fold truncation distance to define a tubular band of the outer surface that is not covered by the outer sleeve.

9. A method for forming a protected connection assembly, the method comprising:
forming an electrical connection between first and second electrical cables;
providing a cover assembly including a joint body including:
a tubular inner sleeve formed of an elastically expandable, electrically insulating material and having an outer surface and opposed first and second terminal ends, the inner sleeve defining a through passage extending axially from a first end opening at the first terminal end of the inner sleeve to a second end opening at the second terminal end of the inner sleeve;
an integral semiconductor layer on the outer surface of the inner sleeve and formed of an electrically semiconductive material, the semiconductor layer extending axially from a first terminal end of the semiconductor layer to an opposing second terminal end of the semiconductor layer; and
a tubular, metal shield layer surrounding the semiconductor layer;
wherein the first terminal end of the semiconductor layer is spaced apart from the first terminal end of the inner sleeve a prescribed semiconductor truncation distance to define a tubular band of the outer surface that is not covered by the semiconductor layer; and
mounting the cover assembly on the first and second cables such that the first and second cables and the electrical connection extend through the inner sleeve, the first cable extends out of the inner sleeve through the first end opening, and the second cable extends out of the inner sleeve through the second end opening;
wherein:
the metal shield layer extends axially from a first terminal end of the metal shield layer to an opposing second terminal end of the metal shield layer;
the first terminal end of the metal shield layer is spaced apart from the first terminal end of the inner sleeve a prescribed shield truncation distance to define a tubular band of the outer surface that is not covered by the metal shield layer; and
when the protected connection assembly is formed, an annular gap is defined between the first terminal end of the inner sleeve and a first cable shield of the first cable to electrically isolate the metal shield layer from the first cable shield and thereby provide a shield break between the first cable shield and a second cable shield of the second cable.

10. The method of claim 9 wherein the second terminal end of the semiconductor layer extends to the second terminal end of the inner sleeve or is axially spaced therefrom a second semiconductor truncation distance that is less than the prescribed semiconductor truncation distance.

11. The method of claim 9 including:
providing a removable holdout device mounted within the inner sleeve, wherein the holdout device temporarily maintains the inner sleeve in a radially expanded state;
and thereafter removing the holdout from the inner sleeve to permit the inner sleeve to radially retract on to the first and second cables and the electrical connection.

12. The method of claim 9 wherein:
the metal shield layer includes a shield extension section configured to be extended axially beyond the second end of the inner sleeve;
the method includes extending the shield extension to axially overlap and electrically contact a semiconductor layer of the second cable; and
when the protected connection assembly is formed, the metal shield layer does not contact a semiconductor layer of the first cable.

13. The method of claim 9 including mounting a flowable, electrically insulating void filler material in the gap.

14. The method of claim 13 including mounting a flowable second electrically insulating material to surround the void filler material, wherein the void filler material is softer than the second electrically insulating material.

15. The method of claim 9 including:
providing the cover assembly as a pre-expanded unit including:
  a removable holdout device mounted within the inner sleeve, wherein the holdout device is operative to temporarily maintain the inner sleeve in a radially expanded state;
a tubular outer sleeve surrounding the metal shield layer;
  a Faraday cage layer mounted within the inner sleeve and formed of an electrically conductive elastomer; and
  a stress cone mounted in the inner sleeve proximate an end thereof and formed of an electrically conductive elastomer;
  wherein:
    the second terminal end of the semiconductor layer extends to the second terminal end of the inner sleeve or is axially spaced therefrom a second semiconductor truncation distance that is less than the prescribed semiconductor truncation distance;
    the metal shield layer includes a shield extension section configured to be extended axially beyond the second end of the inner sleeve; and
    the outer sleeve includes:
      an intermediate section surrounding the inner sleeve; and
      an outer section surrounding the intermediate section and joined thereto at an annular fold;
      the annular fold being spaced apart from the first terminal end of the inner sleeve a prescribed fold truncation distance to define a tubular band of the outer surface that is not covered by the outer sleeve; and
removing the holdout from the inner sleeve to permit the inner sleeve to radially retract on to the first and second cables and the electrical connection.

16. A protected connection assembly comprising:
first and second electrical cables;
an electrical connector forming an electrical connection between the first and second cables;
a cover assembly including a joint body including:
  a tubular inner sleeve formed of an elastically expandable, electrically insulating material and having an outer surface and opposed first and second terminal ends, the inner sleeve defining a through passage extending axially from a first end opening at the first terminal end of the inner sleeve to a second end opening at the second terminal end of the inner sleeve;
  an integral semiconductor layer on the outer surface of the inner sleeve and formed of an electrically semiconductive material, the semiconductor layer extending axially from a first terminal end of the semiconductor layer to an opposing second terminal end of the semiconductor layer; and
  a tubular, metal shield layer surrounding the semiconductor layer;
  wherein the first terminal end of the semiconductor layer is spaced apart from the first terminal end of the inner sleeve a prescribed semiconductor truncation distance to define a tubular band of the outer surface that is not covered by the semiconductor layer; and
wherein the cover assembly is mounted on the first and second cables such that the first and second cables and the electrical connection extend through the inner sleeve, the first cable extends out of the inner sleeve through the first end opening, and the second cable extends out of the inner sleeve through the second end opening;
wherein:
  the metal shield layer extends axially from a first terminal end of the metal shield layer to an opposing second terminal end of the metal shield layer;
  the first terminal end of the metal shield layer is spaced apart from the first terminal end of the inner sleeve a prescribed shield truncation distance to define a tubular band of the outer surface that is not covered by the metal shield layer; and
  an annular gap is defined between the first terminal end of the inner sleeve and a first cable shield of the first cable to electrically isolate the metal shield layer from the first cable shield and thereby provide a shield break between the first cable shield and a second cable shield of the second cable.

17. The protected connection assembly of claim 16 including a flowable, electrically insulating void filler material in the gap.

18. The protected connection assembly of claim 17 including a flowable second electrically insulating material surrounding the void filler material, wherein the void filler material is softer than the second electrically insulating material.

19. A cover assembly for covering and electrically insulating an electrical connection, the cover assembly comprising:
a joint body including:
  a tubular inner sleeve formed of an elastically expandable, electrically insulating material and having an outer surface and opposed first and second terminal ends, the inner sleeve defining a through passage extending axially from a first end opening at the first terminal end of the inner sleeve to a second terminal end opening at the second end of the inner sleeve;
  an integral semiconductor layer on the outer surface of the inner sleeve and formed of an electrically semiconductive material, the semiconductor layer extending axially from a first terminal end of the semiconductor layer to an opposing second terminal end of the semiconductor layer; and
  a tubular, metal shield layer surrounding the semiconductor layer;
  wherein:
    the first terminal end of the semiconductor layer is spaced apart from the first terminal end of the inner sleeve a prescribed semiconductor truncation distance to define a tubular band of the outer surface that is not covered by the semiconductor layer;
    the metal shield layer extends axially from a first terminal end of the metal shield layer to an opposing second terminal end of the metal shield layer;
    the first terminal end of the metal shield layer is spaced apart from the first terminal end of the inner sleeve a prescribed shield truncation distance to define a tubular band of the outer surface that is not covered by the metal shield layer; and
    the first terminal end of the metal shield layer is also spaced apart from the first terminal end of the semiconductor layer a prescribed axial distance to define a tubular band of the semiconductor layer that is not covered by the metal shield layer.

* * * * *